(12) United States Patent
Chhabra

(10) Patent No.: US 9,728,232 B2
(45) Date of Patent: Aug. 8, 2017

(54) SYSTEM AND METHOD FOR AUTOMATIC DETECTION OF POWER UP FOR A DUAL-RAIL CIRCUIT

(71) Applicant: STMicroelectronics International N.V., Amsterdam (NL)

(72) Inventor: Amit Chhabra, Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/167,101

(22) Filed: May 27, 2016

(65) Prior Publication Data

US 2016/0275999 A1    Sep. 22, 2016

Related U.S. Application Data

(62) Division of application No. 14/329,747, filed on Jul. 11, 2014, now Pat. No. 9,378,779.

(51) Int. Cl.
*G11C 5/14* (2006.01)
*G05F 1/46* (2006.01)
*H03K 3/037* (2006.01)
*H03K 5/08* (2006.01)
*H03K 17/22* (2006.01)

(52) U.S. Cl.
CPC ............. *G11C 5/148* (2013.01); *G05F 1/46* (2013.01); *G05F 1/465* (2013.01); *H03K 3/0377* (2013.01); *H03K 5/082* (2013.01); *H03K 17/223* (2013.01)

(58) Field of Classification Search
CPC ........ G11C 5/144; G11C 5/148; G06F 1/465; G06F 1/462; G06F 1/46
See application file for complete search history.

(56) References Cited

U.S. PATENT DOCUMENTS

| | | | |
|---|---|---|---|
| 9,094,013 B2 | 7/2015 | Smith et al. | |
| 9,124,268 B2 | 9/2015 | Lee | |
| 9,378,779 B2 * | 6/2016 | Chhabra | G11C 5/148 |
| 2012/0226929 A1 | 9/2012 | Lee | |

* cited by examiner

*Primary Examiner* — Andrew Q Tran
(74) *Attorney, Agent, or Firm* — Gardere Wynne Sewell LLP

(57) ABSTRACT

When powering-up or exiting from a sleep mode, the ramping up of various supply voltage nodes may occur at different rates. Thus, in a dual-rail memory circuit, a first voltage rail may be at voltage before a second voltage rail. Such a transient state of operation may lead to current spikes that unnecessarily draw power and introduce undesired inefficiency. An internal sleep signal generation circuit in the dual-rail memory circuit precisely controls an internal sleep signal such that the transition from off or sleep mode to operating mode is set to assure that the supply voltage nodes are close enough to the at-voltage operating level before releasing the sleep mode.

23 Claims, 3 Drawing Sheets

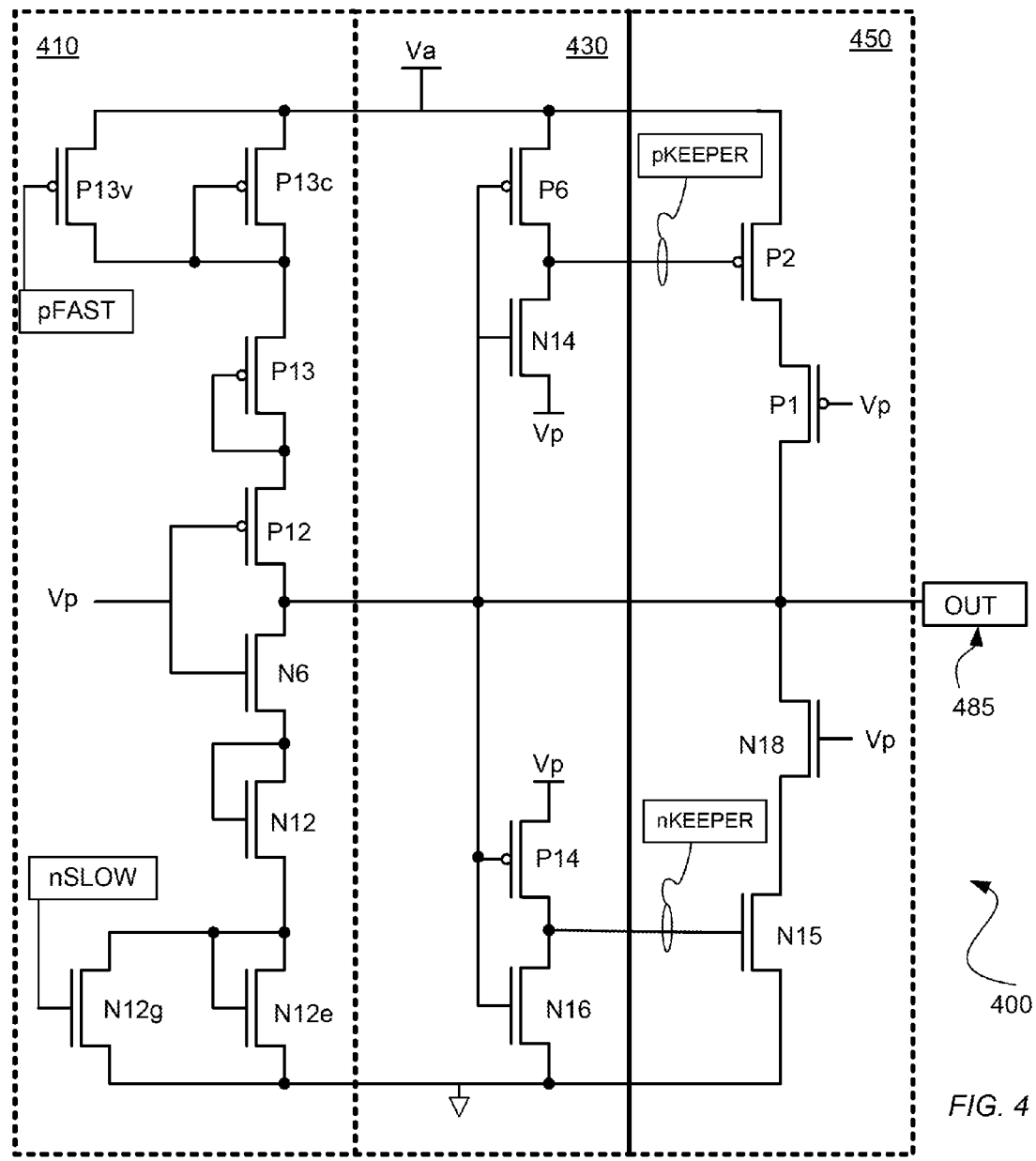
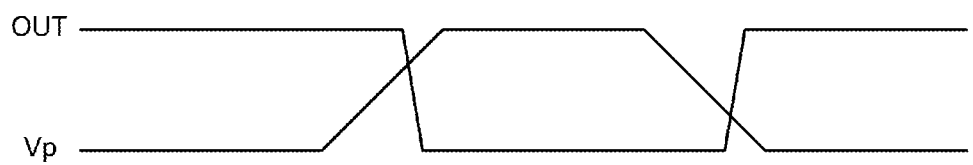
FIG. 4
FIG. 5

SYSTEM AND METHOD FOR AUTOMATIC DETECTION OF POWER UP FOR A DUAL-RAIL CIRCUIT

CROSS REFERENCE TO RELATED APPLICATION

This application is a divisional application from U.S. patent application Ser. No. 14/329,747 filed Jul. 11, 2014, the disclosure of which is incorporated by reference.

BACKGROUND

Memory systems integrated on semiconductor chips (e.g., System-on-Chip (SoC) memory) have commonly used two different power supply nodes for operation and storing of data therein. Such integrated circuit memory is often referred to as a dual-rail memory circuit. In such a dual-rail memory, the circuit will often use a first voltage supply rail for periphery circuitry (i.e., the input/output I/O) provided by a first power supply node, and second voltage supply rail with a voltage provided by a second power supply node for the memory array. Having two different power supply nodes in a dual-rail memory is advantageous because one of the voltage supply nodes (the first supply node supplying voltage to the peripheral circuitry) may be reduced to zero volts or near zero volts during periods of non-use (e.g., sleep mode). However, the second supply voltage for the memory array is kept at the usual voltage level in order to maintain data stored in the memory cells. Another major advantage of the dual rail memory circuit is that it allows to reduce the voltage level of the first supply node thereby enabling low power modes.

Computing systems, therefore, may employ an overall power usage strategy for all circuits in the computing system. Thus, when the computing system enters into a sleep mode, a sleep signal may be conveyed to specific circuit blocks designated to enter into a power-saving mode via the sleep signal. Thus, a typical dual-rail memory is suited to utilize sleep mode by powering down the peripheral I/O circuitry when not in use. When exiting sleep mode, however, it is necessary to ensure that the first voltage supply node that supplies the peripheral I/O circuitry is ramped back up to the desired operating voltage level in a manner that ensures that data written to or read from the memory array will be accurately handled. Further, the same circuitry typically used for ensuring proper signal level of the first voltage rail should also function correctly during the first power-on event as well (e.g., restarting the entire computing system).

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

FIG. 4 is a circuit diagram of a sleep signal generation circuit for a dual rail memory;

FIG. 5 is a timing diagram of the sleep signal generation circuit of FIG. 4;

DETAILED DESCRIPTION

Figure 1:
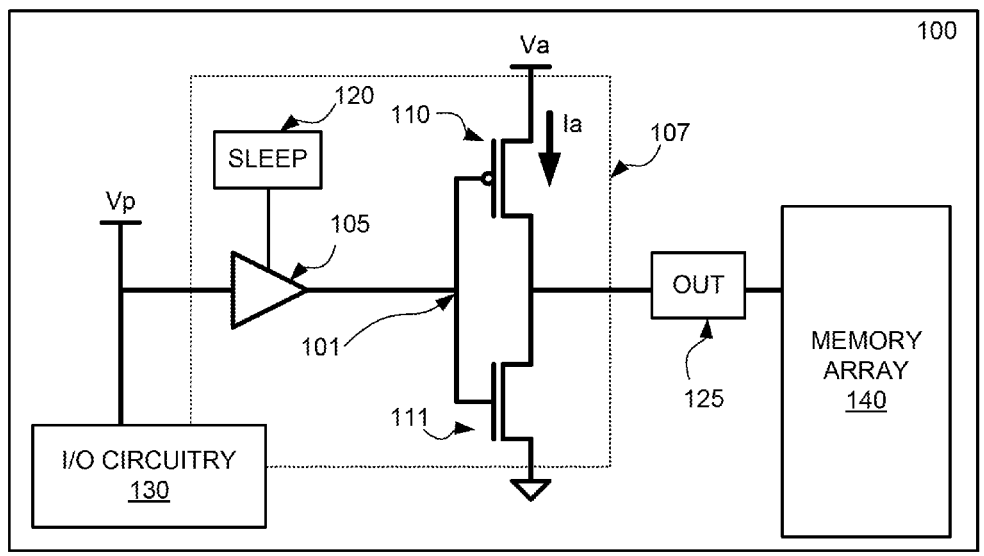
FIG. 1 is a circuit diagram a dual rail memory circuit configured to utilize a sleep signal input for power management.

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a dual-rail memory circuit having a sleep generation circuit configured to prevent undesired currents from being generated when transitioning power states. When a dual-rail memory circuit exits from a sleep mode or recovers from a Power-On Reset (POR) event, the ramping up of various supply voltage nodes may occur at different rates. Thus, in a dual-rail memory circuit, a first voltage rail may be at voltage before a second voltage rail. Such a transient state of operation may lead to current spikes that unnecessarily draw power and introduce undesired inefficiency. While steady-state operation is unaffected, transitioning in and out of sleep mode and recovering from POR events may be more prevalent in personal computing devices, such as smart phones and the like, because users may often "wake up" the device to check something quickly and then place the device back into sleep mode. If the dual rail memory circuit is exiting from a retention mode (that is a mode where the memory array contents are retained), then current spikes may be automatically taken care of by the sleep input signal. A sleep input node pin is normally kept asserted until all supply voltage nodes have stabilized. On the other hand, the problem may be more severe during first power-up or during exiting from non-retention modes of a dual-rail memory circuit. Conventional solutions do not place any constraint on sleep input signals to alleviate the current spike at first power up. Hence, this will lead to current spikes due to differential ramp-up rates of the voltage supply nodes.

An embodiment of sleep signal generation circuit in a dual-rail memory circuit may be used to precisely control an internal sleep signal such that the transition from sleep mode to operating mode is set to assure that the supply voltage nodes are close enough to the at-voltage operating level before releasing the sleep mode. Internally controlling the sleep mode signal will alleviate current spikes that may result from portions of the memory circuit from having undesired currents generated as a result of one supply voltage reaching its at-voltage level before a second supply voltage. Further, as is typical in dual-rail memory circuits, when coming out of sleep mode, one supply voltage will already be at-voltage (to maintain operation of the memory blocks themselves) while input circuitry coupled to a second voltage supply is ramped up for use when the system "wakes up." These and other aspects are discussed below with respect to FIGS. 1-7.

FIG. 1 is a circuit diagram a dual-rail memory 100 configured to utilize a sleep signal input for power management according to an embodiment of the subject matter disclosed herein. In FIG. 1, the dual-rail memory 100 utilizes two supply voltage nodes Va and Vp for handling operations of the dual-rail memory 100. The first supply voltage node Vp provides voltage supply signal for the peripheral circuitry (e.g., the I/O circuitry 130, control circuitry, etc.—not shown individually). The second supply voltage node Va provides a supply voltage signal to the memory array 140 and part of row-decoder circuitry (also not shown in FIG. 1). As is typical, in a normal steady state of operation (e.g., not sleep mode), the first supply voltage Va may be greater than the second supply voltage Vp.

In dual-rail memory systems, memory array signals may be handled at a first logic level (for example, 0V for low logic level and 5V for high logic level) corresponding to the supply voltage Va while I/O array signals may be handled at a second logic level (for example, 0V for low logic level and 3.5V for high logic level) corresponding to the supply voltage Vp. Therefore, when passing an I/O signal 101 from I/O circuitry 130 to the memory array 140, a level-shifting circuit, such as inverter 107, is used to change the initial I/O signal 101 from a logic level in the Vp domain to an output signal 125 having a logic level in the Va domain.

The inverter 107 includes two MOS transistors, a PMOS transistor 110 and an NMOS transistor 111, that are coupled together to form the inverter. Thus, the source node of the PMOS transistor 110 is coupled to the supply voltage node Va and the source node of the NMOS transistor 111 is coupled to a reference node. Both gate nodes of the PMOS and NMOS transistors 110 and 111 are coupled together and coupled to an input node for the I/O signal 101 (through a logic circuit 105 as is discussed further below). Further, both drain nodes of the PMOS and NMOS transistors 110 and 111 are coupled together to form an output node 125 for the level shifting circuit 107.

During steady-state operation (long after a wake-up from sleep mode or power-on reset), when Vp is at a low level (and, thus, the input node 101 is at a low logic level), the PMOS transistor 110 is turned on such that current is drawn through the PMOS transistor 110 pulling the voltage at the output node 125 up to the Va supply voltage level. Since the input node 101 is at a low logic level, the NMOS transistor 111 is off and the output node 125 is uncoupled from the reference node. Likewise, when Vp is at a high level (and, thus, the input node 101 is at a high logic level), the NMOS transistor 111 is turned on such that current is drawn through the NMOS transistor 110 pulling the voltage at the output node 125 down to the reference level. Since the input node 101 is at a low logic level, the PMOS transistor 110 is off and the output node 125 is uncoupled from the supply voltage node Va.

To take advantage of having separate power supply nodes (i.e., dual-rail), the memory 100 may be put into a power saving mode (called sleep mode hereinafter) whereby the voltage supply node Vp is lowered to zero or near zero while the voltage supply node Va is maintained such that data stored in the memory array 140 is maintained. Such a sleep mode may be initiated by a power management circuit (not shown in FIG. 1) that asserts a sleep signal 120 that causes various circuits in an overall system to enter into sleep mode. In FIG. 1, the sleep signal interrupts the supply voltage signal Vp by maintaining the input node 101 at low logic level, irrespective of the input voltage. During exit from sleep mode, the sleep signal is asserted throughout the time when supply voltage signal Vp is ramping up to voltage. However, when returning from sleep mode without retention requirement or when first powering up the system after a POR event, the sleep signal may not keep input node 101 at low logic level. If the input node 101 follows supply voltage signal Vp, the ramping up of the supply voltage signal Vp may lead to problems with the operation of the memory 100. One such problem is illustrated with respect to the timing diagrams shown in FIGS. 2A-2C.

Figure 2A:
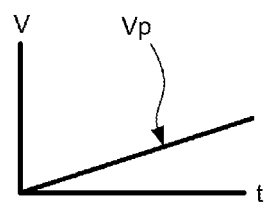
FIGS. 2A-2C are timing diagrams of voltage and current signals in a dual-rail memory circuit that exhibits a crow-bar current when transitioning power states when the control in FIG. 1 is absent.
Figure 2B:
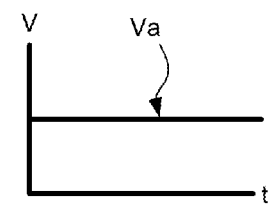
Figure 2C:
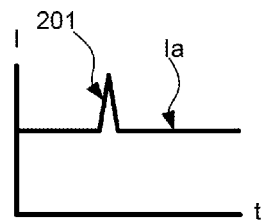

FIGS. 2A-2C are timing diagrams of voltage and current signals in a dual-rail memory 100 that exhibits a crow-bar current when transitioning out of sleep mode without retention. When the system implements an operation whereby the memory 100 is to be used after being in sleep mode, the supply voltage Vp will start at 0V and ramp up to a high-logic level voltage as shown in FIG. 2A. By its nature, the supply voltage Vp does not instantaneously jump to its steady-state voltage level. Instead, the supply voltage Vp ramps up toward its steady-state value rather slowly. The ramp-up slope of power supplies is normally on the order of few microseconds, as compared to circuits that function in a nanoseconds timescale. Further, when exiting sleep mode, as mentioned previously, the supply voltage Va remains at steady-state voltage as sown in FIG. 2B.

Therefore, during the ramp up of supply voltage Vp, when the input node 101 is still closer to the low-voltage level, the PMOS transistor 110 is on until the input node 101 voltage rises above a turn-off threshold. However, prior to turning off the PMOS transistor 110 due to the input node exceeding the turn-off voltage threshold, the NMOS transistor 111 begins conducting as the supply voltage Vp rises above the turn-on threshold voltage of the NMOS transistor 111. This period of time when both of the PMOS and NMOS transistors 110 and 111 are on, results in a short circuit from the supply voltage Va to the reference node. The time for this short circuit current is significantly large (microseconds) as compared to normal operation of the circuit. This short circuit generates a sizable transient current spike 201 in the current Ia conducted through the PMOS and NMOS transistors 110 and 111. This spike current spike 201, as shown in FIG. 2C is called a crowbar current.

The sum of the crowbar currents for all interface inverters in a memory 100 can be significant, e.g., in the range of microamperes (µA), or even milliamperes (mA). Unfortunately, the time duration of this crowbar current is also large, due to the large ramp-up time of the supply voltage Vp. If the time duration is short, then the impact of the transient spike 201 of current Ia is less severe due to the fact that the supply voltage Va decoupling capacitance provides the necessary charge to mitigate the transient spike 201, and the voltage drop on the supply voltage Va is not significant. However, if the time duration of the transient spike 201 is quite large, then the voltage drop on supply voltage Va can also be quite significant. Hence, a large transient spike 201 drawn from the supply voltage Va for a long duration may cause supply voltage Va to drop low enough that the memory array 140 malfunctions, and may thus give rise to corrupted data.

Figure 2D:
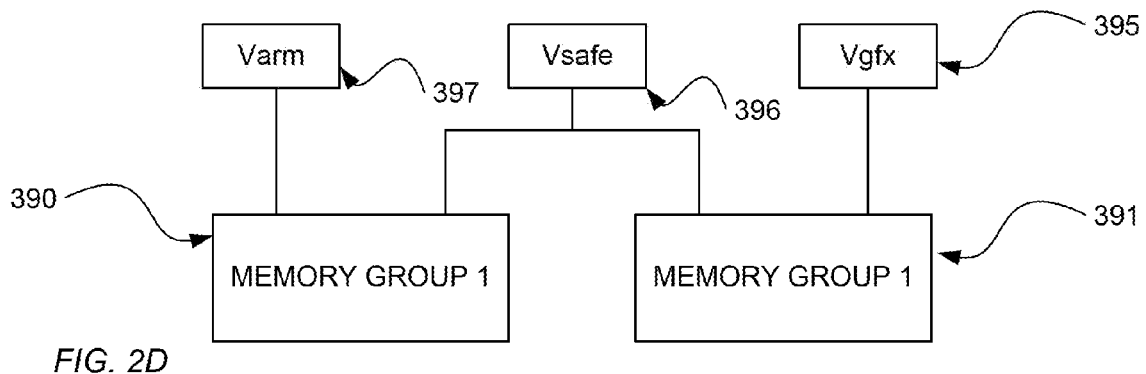
FIG. 2D is a block diagram of two groups of memories that share a common power supply, but have separate periphery power supplies.

For example, in a system as shown in FIG. 2D, a first memory group 390 and a second memory group 395 may be in an overall system and drawing power from a common power supply Vsafe 397. Further, each of the memory groups 390 and 395 may have a peripheral power supply for periphery circuitry. Thus, the first memory group 390 may have a peripheral power supply Varm 398 and the second memory group 395 may have a peripheral power supply Vgfx 396. In a problematic scenario, if the second memory group exits sleep mode and generates a crowbar current as described above on the common power supply node Vsafe 397, such a current glitch may pull the voltage here down enough to affect the first memory group 390. That is, such a current glitch from a crowbar current may corrupt data in a memory circuit that was never in sleep mode.

One solution is to manage the nature of the sleep signal to a greater degree both within the memory 100 and through a power management unit (not shown). In a first simple solution, the sleep signal 120 may be used with each inverter interface 107 in a NAND or NOR configuration. Thus, the logic circuit 105 may be a NAND or NOR gate. For example, for a NOR gate 105, when the sleep input 120 is at logic 1 when deasserted (e.g., sleep mode just transitioned from being asserted to deasserted), the supply voltage Vp begins ramping up until it reaches its steady-state value (or another suitable value, such as 80% of its steady-state value). But because of the NOR gate 105, the supply voltage signal will not affect the transistors 110 and 111 of the inverter 107 until the NOR logic gate 105 passes the signal once the supply voltage Vp reaches a threshold by which the logic gate 105 is triggered. This threshold is higher than the turn-on and turn-off thresholds of the transistors 110 and 111 and therefore prevents the above-described crowbar spike 201 from flowing in inverter interface 107. Such a solution may also work for a NAND gate if the sleep input 120 is inverted and at logic 0 unless asserted. While the above-described solution may alleviate crowbar spikes 201 when transitioning out of sleep mode, additional problems present themselves when powering up the memory 100 after a POR event.

Figure 3A:
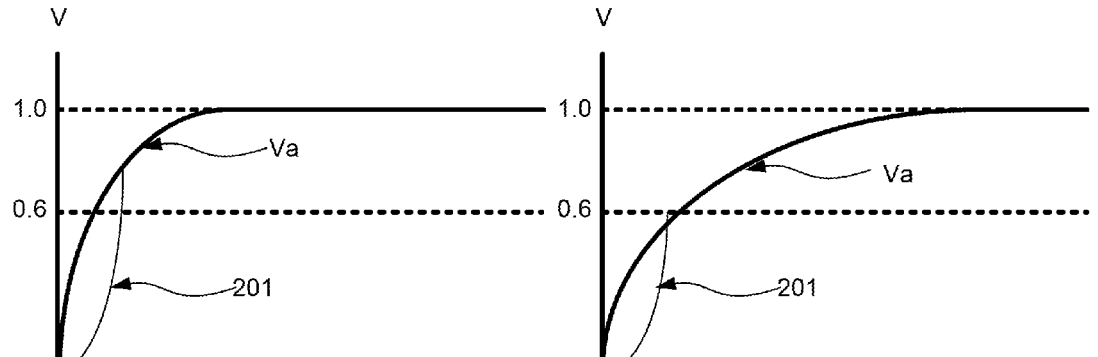
FIGS. 3A-3B are timing diagrams of power and sleep input signals in a dual-rail memory circuit.
Figure 3B:
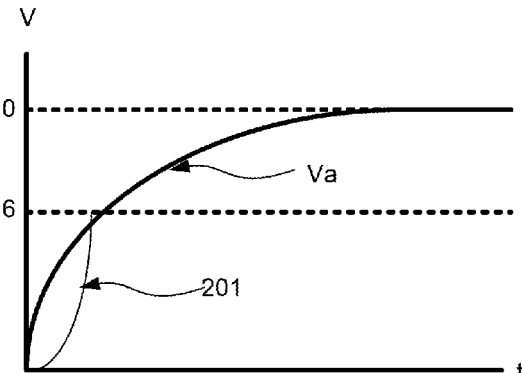

FIGS. 3A-3B are timing diagrams of Va and sleep signal in a dual-rail memory circuit, where the waveform of sleep signal can lead to a crowbar current during a power-up event in spite of using off-chip sleep signal power management as proposed in above paragraph. During power up, the sleep signal generated from the power management unit must reach the memory instance boundary before a predetermined threshold of Va. This threshold is set at a point above which the crowbar current from the supply voltage Va becomes significant. As an example, if the supply voltage Va is too small, for example 0.3V, then the crowbar current will not be significant. Hence, the sleep signal can assume any value. On the contrary, if the supply voltage Va is too large, for example 0.9V, then the crowbar current will become significant. Hence, this threshold value has to be carefully chosen so that the impact of a crowbar current has not started when the supply voltage Va is at or below the threshold. For example, in FIGS. 3A and 3B, the threshold voltage is taken to be 0.6V. Further, in FIG. 3A, the sleep signal 201 reaches Va after Va crosses the 0.6V threshold. Therefore, during the time between when the supply voltage Va reaches the 0.6 threshold and when the sleep signal 201 reaches the Va, a crowbar current will ensue. Thus, in order to prevent crowbar current during a power-up event, the sleep signal 201 must equal Va before supply voltage Va reaches the predetermined threshold level. FIG. 3B shows an example of a proper ramp-up relationship between supply voltage Va and the sleep signal 201.

This will impose constraints on the ramp-up slope of the Va supply. If the Va supply is ramped-up too fast (as shown in FIG. 3A), the sleep signal may be at logic low at the boundary of the memory, in-spite of the power management unit driving it to logic high. Therefore, the ramp-up rate of Va must be slow enough so that the sleep signal 201 reaches the memory boundary.

Such constraints add to the overall complexity of the system in which the memory 100 is utilized. A better approach, as described next with respect to FIG. 4, is to use a sleep signal without regard to specific value and timing constraints such that a system designer is no longer beholden to sleep signal constraints due to the memory 100.

FIG. 4 is a circuit diagram a sleep signal generation circuit 400 for a dual rail memory. In general, the circuit 400 of FIG. 4 may be embedded within a dual-rail memory integrated circuit chip, such that the handling of sleep signals becomes part of the system-on-chip and the need for external constraints on a power management unit are eliminated. Further, this circuit 400 may be part of several memory blocks in a dual-rail memory integrated circuit chip as may be desired for efficiency and functionality. Thus, it is desired that this circuit 400 within a memory block is configured to detect when supply voltage Va and supply voltage Vp are at proper levels, and generate an internal sleep signal based on these detections.

In FIG. 4, the circuit 400 includes an output node 485 that will have a sleep signal generated thereon based upon signal inputs from supply voltage Vp and supply voltage Va. The following description will operate under the assumption that supply voltage Va is greater than supply voltage Vp as if this is not true, then there exists no need in the first place to generate the internal sleep signal as no crowbar current will ever be present. In this embodiment, the circuit 400 may be divided into three stages: an input stage 410, an auto-sequencing stage 430, and an output stage 450.

The first of these three stages is situated on the left of the circuit 400 and is the input stage 410. This stage 410 is configured to set voltages at which the internal sleep signal 485 transitions from logic 1 (asserted) to logic 0 (deasserted) during ramp up of the supply voltage Vp, and at which the internal sleep signal 485 transitions from a logic 0 to a logic 1 during ramp down of the supply voltage Vp. As discussed below, the input stage 410 also adds hysteresis to the circuit 400. The second (middle) stage is the auto-sequencing stage 430. This stage 430 ensures that the transistors in the third stage 450 switch at appropriate times so that a crowbar current does not flow in the modified push-pull stage 450. The third stage 450 is an output 450, which is a modified push-pull circuit that amplifies the internal sleep signal 485 and acts as a "keeper" which is described in greater detail below.

In operation, one assumes that because the supply voltage Va is already designed to ramp-up to its voltage level much faster than supply voltage Vp, then supply voltage Va will be at a stable voltage with which to begin in the next paragraphs. Thus, when supply voltage Vp=0V, the NMOS transistor N6 and the diode-connected NMOS transistors N12 and N12e are off, and the PMOS transistor P12 and the diode-connected PMOS transistors P13 and P13c are on. Therefore, the voltage at the node between the input transistors PMOS P12 and NMOS N6, which is also the internal sleep signal node 485, is at logic 1 at a voltage of approximately Va−2Vt wherein Vt is the typical voltage threshold drop across a MOS transistor and the estimated overall voltage drop across the PMOS transistor P12 and two diode-connected PMOS transistors P13 and P13c is 2Vt. Since the internal sleep signal node 485 has no path to ground at this point, the PMOS transistor stack (P12, P13, and P13c) of the first stage 410 will continue to charge the internal sleep signal node 485 with sub-threshold current.

When the voltage at internal sleep signal node 485 node rises sufficiently to make transistor P6 turn off and N14 turn on, the pKEEPER node is pulled down to supply voltage Vp value that itself is 0V. Therefore, PMOS transistor P2, in the push-pull stage 450, turns on, and PMOS transistor P1 also turns on because supply voltage Vp is zero, thus pulling the internal sleep signal node 485 up to logic 1 (Va). As the internal sleep signal node 485 is held at Va, then PMOS transistor P6 turns off so that no crowbar current will flow through P6 and NMOS transistor N14.

In an opposite, yet reinforcing manner in the lower portion of the circuit 400, because the source of PMOS transistor P14 is coupled to supply voltage Vp, it is off, and because the gate of NMOS transistor N16 is coupled first to Va−2Vt, and then quickly to Va per above, PMOS transistor P14 and NMOS transistor N16 do not draw a crowbar current, nKEEPER is logic 0 (0V), both NMOS transistors N15 and N18 at the bottom of the output stage are off, and this reinforces the logic 1 (Va) at the internal sleep signal node 385.

As supply voltage Vp ramps up from zero, there comes a point when the voltage Vp becomes high enough such that the NMOS transistors N6, N12, and N12e begin to turn on, and the sleep signal node 485 starts falling. Because supply voltage Vp is coupled to the source of the NMOS transistor N14, the drive of N14 becomes weaker, and the drive of PMOS transistor P6 becomes stronger such that P6 quickly pulls pKEEPER to logic 1 (Va). This turns off PMOS transistor P2. Furthermore, the signal nKEEPER is low at logic 0 (0V) to turn the NMOS transistor N15 off.

Next, because the source of PMOS transistor P14 is coupled to supply voltage Vp, not to supply voltage Va as is the source of PMOS transistor P6, and because the source of NMOS transistor N16 is coupled to ground, and not to supply voltage Vp like the source of NMOS transistor N14, it takes longer for P14 to pull nKEEPER up to logic 1 (based on Vp) than it does for P6 to pull pKEEPER up to logic 1 (based on Va). Therefore, NMOS transistor N15 turns on to pull the internal sleep signal node 485 to logic 0 (0V), but only after PMOS transistor P2 turns off. Therefore, this inherent delay between the time that P2 turns off and the time that N15 turns on prevents a crowbar current from flowing in the output stage 450. The transistors P1 and N18 in the output stage serve as a fail-safe mechanism to cut off the push-pull stage 450 when the nodes pKEEPER and nKEEPER are floating or weakly driven.

As soon as nKEEPER transitions to logic 1, it causes NMOS transistor N15 to provide a much greater sink current to drive the internal sleep signal 485 to 0. Before nKEEPER transitions from 0 to 1, the sink current was provided by NMOS transistor N6 and other diode connected NMOS transistor N12 in series. Hence, the internal sleep signal 385 falls immediately when nKEEPER transitions to logic 1. This way, beyond the threshold of Vp when nKEEPER trips, the internal sleep signal 385 slope becomes independent on the supply voltage Vp slope.

For the circuit 400 to transition the internal sleep signal back to logic 1, supply voltage Vp must fall low enough to cause a current to flow through PMOS transistors P12, P13, and P13c, where the current is high enough to turn off PMOS transistor P14 and turn on NMOS transistor N16. Therefore, the circuit 400 exhibits hysteresis because to transition the internal sleep signal 485 from 0 to 1, supply voltage Vp must fall significantly lower than the point at which the supply voltage Vp caused internal sleep signal 485 to transition from 1 to 0. Moreover, in a manner reverse to that described above, nKEEPER falls to logic 0 (0V) before pKEEPER falls to logic zero (0V) such that the NMOS transistor N15 turns off before the output PMOS transistor P2 turns on, thus preventing a crowbar current from flowing in the output stage 450 while supply voltage Vp ramps down.

Furthermore, once the circuit 400 transitions the internal sleep signal 485 from a logic 1 to a logic 0, the circuit 400 holds the internal sleep signal 485 at 0V even if supply voltage Vp becomes greater than supply voltage Va. Therefore, the circuit 400 is immune to glitches on supply voltage Va and supply voltage Vp during steady-state operation. Further yet, because of the higher effective threshold voltage Vt provided by the diode-connected transistors of the input stage 410, when supply voltage Vp reaches its final value (or when Vp is zero), the input stage 410 draws little or no quiescent current. This is desirable in the context of a functional mode, where supply voltage Vp can be less than supply voltage Va.

The transistors NMOS N12g and PMOS P13v allow trimming the voltage at which the input stage will react to the input ramp up and down of Vp. This can be used to calibrate the circuit in correlation with the process of the dual-rail memory chip (i.e., is the chip "fast" or "slow"). This calibration can be done at the time of electrical wafer sort (EWS) during production testing. If the chip has "fast" NMOS transistor, then transistor NMOS N12g can be off to allow NMOS N12e to increase the turn-on threshold of the circuit 400. Similarly, if the chip has "fast" PMOS transistor, then transistor PMOS P13v can be off to increase the turn-off threshold of the circuit 400. In contrast, if the chip is "slow" for NMOS and/or PMOS transistors, then NMOS N12g and/or PMOS P13v are on to short out transistors NMOS N12e and/or PMOS P13c, and thus to reduce the turn-on and/or turn-off thresholds of the sleep-signal generation circuit 400. These trimming transistors NMOS N12g and PMOS P13v may be controlled by user-configurable nodes pFAST and nSLOW. These timing relationships may be better understood with reference to FIG. 5 as described next.

FIG. 5 is a timing diagram of signals in a dual-rail memory circuit having the sleep signal generation circuit of FIG. 4. FIG. 5 shows the timing relationship between the internal sleep signal OUT 485 of FIG. 4 and the ramping up and ramping down of the supply voltage Vp. At initial state, when exiting sleep mode or cycling after a POR event, supply voltage Vp is at 0V while the internal sleep signal remains at logic 1. As supply voltage Vp begins to ramp up, the internal sleep signal node 485 does not change as the pKEEPER signal is holding the internal sleep node at logic 1 until a threshold. The threshold is when NMOS transistor N15 turns on to pull the internal sleep signal node 485 to logic 0 (0V), but only after PMOS transistor P2 turns off. Therefore, this inherent delay between the time that P2 turns off and the time that N15 turns on prevents a crowbar current from flowing in the output stage 450. As shown in FIG. 5, the supply voltage Vp is almost at high voltage before the internal sleep signal node 485 begins to drop to logic 0.

In a similar manner, one can see that when the supply voltage Vp begins to ramp down, the internal sleep signal node 485 does not transition back to logic 1 until the voltage is near 0V. In this opposite manner, nKEEPER holds the internal sleep signal node 485 at logic 0 until PMOS transistor P14 turns on to pull the internal sleep signal node 485 to logic 1 (Va), but only after NMOS transistor N15 turns off. Thus, the threshold for transitioning the internal sleep signal node 485 while ramping up the voltage at supply voltage Vp is higher (nearer to Vp) than the threshold for transitioning the internal sleep signal node 485 while ramping down (nearer to 0v). This difference in thresholds provides hysteresis to the circuit 400.

Other embodiments of the concepts illustrated and discussed with respect to FIGS. 4 and 5 are contemplated. For example, the circuit 400 may be implemented with a negative supply voltage Vp and a negative supply voltage Va. In such a circuit, each of the NMOS transistors in the circuit of FIG. 4 would be replaced with a PMOS transistor and each PMOS transistor would be replaced with an NMOS transistors. The circuit would then behave in a reciprocal manner with respect to the negative supply voltages Vp and Va. Another embodiment is discussed next with respect to FIG. 6.

Figure 6:
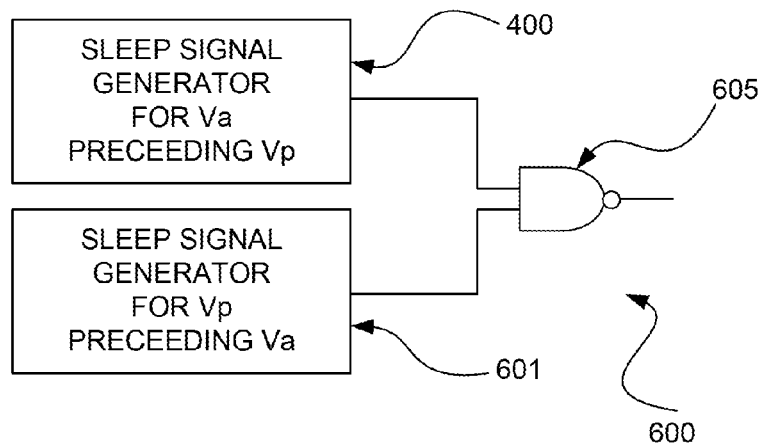
FIG. 6 is a block diagram of dual-rail memory circuit having the sleep signal generation circuit of FIG. 4 and an additional sleep signal generation circuit.

FIG. 6 is a block diagram of dual-rail memory circuit having the sleep signal generation circuit of FIG. 4 and an additional sleep signal generation circuit. In this embodiment, a two-tiered internal sleep signal circuit may be implemented for scenarios where one cannot assume that the supply voltage Va will be at voltage before the supply voltage Vp. In such a two-tiered solution, a first sleep signal generation circuit 400 may be implemented according to FIG. 4 as discussed above. Further, a second parallel sleep signal generation circuit 601 may be implemented similar to the circuit 400 of FIG. 4 except that each connection for the supply voltage node of Va and Vp are swapped. Then the output of each of these circuits 400 and 601 may be inputs to an NAND gate 605 such that a master sleep signal may be generated only when both individual sleep signal generation circuits 400 and 601 yield a sleep signal being asserted or deasserted.

Figure 7:
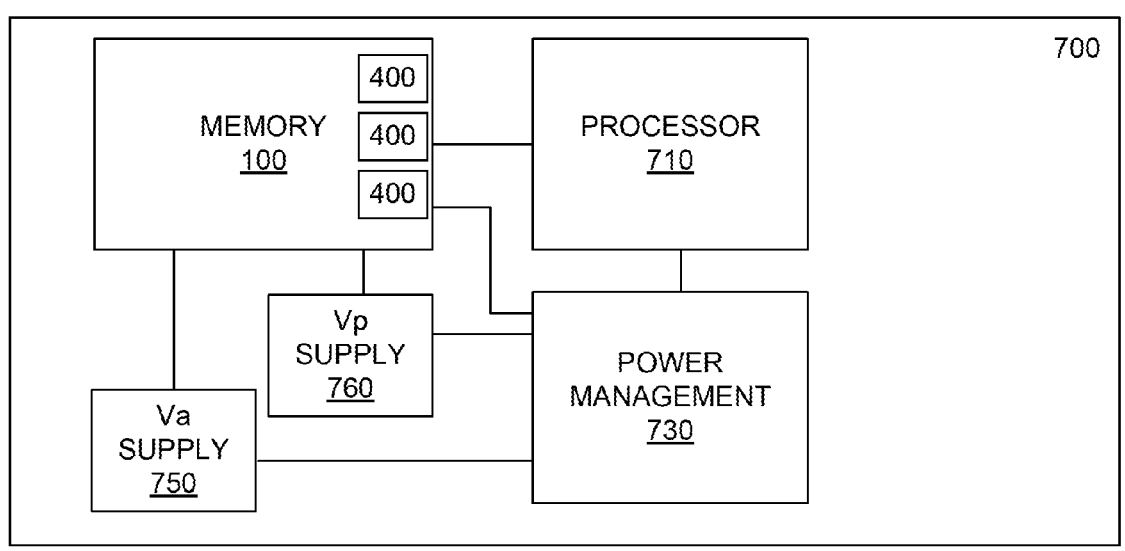
FIG. 7 is block diagram of a computing system having a dual-rail memory circuit.

FIG. 7 is block diagram of a computing system 700 having a dual-rail memory circuit according to an embodiment of the subject matter disclosed herein. The computing system 700 may include a dual-rail memory 100 having one or more sleep signal generation circuits 400 as described above with respect to FIG. 4. Because the sleep signal generation circuit 400 of FIG. 4 occupies very little area, it may be used in several (if not all) memory blocks of the dual-rail memory 100 without increasing the SoC footprint. Additionally, each sleep signal generation circuit 400 may be implemented in both Low Voltage Threshold Transistor (LVT) technology or High Voltage Threshold Transistor (HVT) technology. Typically, an HVT implementation will yield less leakage current but are generally slower, whereas an LVT implementation may have greater leakage current but are generally faster.

The dual-rail memory circuit 100 may be coupled to a processor 710, a power management unit 730 and supply voltage generators for supply voltage Vp 760 and supply voltage Va 750. In one embodiment, each of the blocks shown in FIG. 7 comprise individual integrated circuit dies. Other embodiments contemplate any combination of circuits across one or more integrated circuit dies including the entire system 700 as shown in FIG. 7 as one integrated circuit die. In still other embodiments, there may be only a single voltage supply that may be used to generate any number of voltage supply signals for use in various components of the system 700 of FIG. 7.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

The invention claimed is:

1. A memory, comprising:
a first voltage node configured to ramp up to a first voltage magnitude;
a second voltage node having a second voltage magnitude that is greater than the first voltage magnitude; and
a sleep mode generation circuit configured to hold a sleep signal at a first logic value until a ramping voltage at the first voltage node exceeds a threshold voltage and then change the sleep signal to a second logic value.

2. The memory of claim 1, further comprising a dual-rail memory wherein the first voltage node corresponds to a first voltage rail and the second voltage node corresponds to a second voltage rail.

3. The memory of claim 1, wherein the first voltage node is configured to ramp up to the first voltage magnitude during a power-on event.

4. The memory of claim 1, wherein the first voltage node is configured to ramp up to the first voltage magnitude after the memory exits a sleep mode.

5. The memory of claim 1, wherein the first threshold voltage comprises a voltage that is approximately 60% of the first voltage magnitude.

6. The memory of claim 1, wherein the sleep signal generation circuit further comprises a trimming circuit configured to adjust the threshold voltage.

7. The memory of claim 1, wherein the sleep mode generation circuit further comprises a hysteresis circuit configured to avoid glitches in a power-up detection cycle.

8. The memory of claim 1, further comprising:
periphery circuitry coupled to the first supply voltage node; and
memory storage circuitry coupled to the second supply voltage node.

9. The memory of claim 1, wherein the sleep mode generation circuit comprises:
a first transistor of a first conductivity type coupled between the second voltage node and an output node where the sleep signal is generated and having a control terminal coupled to receive a first keeper signal;
a second transistor of a second conductivity type coupled between the output node and a reference voltage node and having a control terminal coupled to receive a second keeper signal; and
an auto-sequencing circuit configured to generate the first and second keeper signals in response to the ramping voltage at the first voltage node such that first transistor is turned off by the first keeper signal prior to the second transistor being turned on by the second keeper signal.

10. The memory of claim 9, wherein the auto-sequencing circuit comprises:
a first inverting circuit coupled between the second voltage node and the second first node, the first inverting circuit having an output generating the first keeper signal and an input coupled to the output node; and
a second inverting circuit coupled between the first voltage node and the reference voltage node, the second inverting circuit having an output generating the second keeper signal and an input coupled to the output node.

11. The memory of claim 9, wherein the sleep mode generation circuit further comprises an input inverting circuit coupled between the second voltage node and the reference voltage node, the input inverting circuit having an input coupled to the first voltage node and an output coupled to the output node.

12. The memory of claim 9, wherein the sleep mode generation circuit further comprises:
a third transistor of the first conductivity type coupled is series with the first transistor between the second voltage node and the output node, said third transistor having a control terminal coupled to the first voltage node; and
a fourth transistor of the second conductivity type coupled is series with the second transistor between the output node and the reference voltage node, said fourth transistor having a control terminal coupled to the first voltage node.

13. The memory of claim 9, wherein the first voltage node is further configured to ramp down to a sleep voltage magnitude, said sleep mode generation circuit further configured to hold the sleep signal at the second logic value until a ramping voltage at the first voltage node falls below another threshold voltage and then change the sleep signal to the first logic value.

14. The memory of claim 13, wherein the auto-sequencing circuit is further configured to generate the first and second keeper signals in response to the ramping voltage at the first voltage node such that second transistor is turned off by the second keeper signal prior to the first transistor being turned on by the first keeper signal.

15. The memory of claim 1, wherein the sleep mode generation circuit comprises:
a first circuit stage including an inverter circuit powered from the second voltage node, the inverter circuit having an input node coupled to the first voltage node and having an output coupled to an output node where the sleep signal is generated;
a second circuit stage including a first auto-sequencing circuit configured to generate a first keeping signal and a second auto-sequencing circuit configured to generate a second keeping signal; and
a third circuit stage having a pull-up circuit controlled by the first keeping signal and configured to hold the output node at a second supply voltage corresponding to the second supply voltage node until before the ramping voltage exceeds the threshold voltage and a pull-down circuit controlled by the second keeping signal and configured to pull the output node to a reference voltage corresponding to a reference voltage node after the ramping voltage exceeds the threshold voltage.

16. The memory of claim 15, wherein the inverter circuit of the first stage comprises:
a first transistor of a first conductivity type having a control node coupled to the input node, a first conduction node coupled to the output node, and a second conduction node coupled to the second voltage node; and
a second transistor of a second conductivity type having a control node coupled to the input node, a first conduction node coupled to the output node, and a second conduction node coupled to a reference voltage node.

17. The memory of claim 16, wherein the first stage further comprises:
a first diode-connected transistor coupled in series with the first transistor between the second voltage node and the output node; and
a second diode-connected transistor coupled in series with the second transistor between the output node and the reference voltage node.

18. The memory of claim 17, wherein the first stage further comprises:
a third diode-connected transistor coupled in series with the first diode-connected transistor; and
a fourth diode-connected transistor coupled in series with the second diode-connected transistor.

19. The memory of claim 18, wherein the first stage further comprises:
a first trimming transistor coupled in parallel to the third diode-connected transistor; and
a second trimming transistor coupled in parallel to the fourth diode-connected transistor;
wherein the first and second trimming transistors are selectively actuated to adjust the threshold voltage.

20. The memory of claim 15, wherein the first auto-sequencing circuit of the second stage comprises:
a first transistor of a first conductivity type having a control node coupled to the output node, a first conduction node coupled to the second supply voltage node and a second conduction node at which the first keeping signal is generated; and
a second transistor of a second conductivity type having a control node coupled to the output node, a first conduction node coupled to the first supply voltage node and a second conduction node coupled to the second conduction node of the first transistor.

21. The memory of claim 15, wherein the second auto-sequencing circuit of the second stage comprises:
a first transistor of a first conductivity type having a control node coupled to the output node, a first conduction node coupled to the first supply voltage node and a second conduction node at which the second keeping signal is generated; and
a second transistor of a second conductivity type having a control node coupled to the output node, a first conduction node coupled to a reference supply voltage node and a second conduction node coupled to the second conduction node of the first transistor.

22. The memory of claim 15, wherein the pull-up circuit of the third stage comprises:
a first transistor of a first conductivity type having a control node coupled to receive the first keeping signal, a first conduction node coupled to the second supply voltage node and a second conduction node; and
a second transistor of the first conductivity type having a control node coupled to the first supply voltage node, a first conduction node coupled to the second conduction node of the first transistor and a second conduction node coupled to the output node.

23. The memory of claim 22, wherein the pull-down circuit of the third stage comprises:
a third transistor of a second conductivity type having a control node coupled to receive the second keeping signal, a first conduction node coupled to a reference supply voltage node and a second conduction node; and
a fourth transistor of the second conductivity type having a control node coupled to the first supply voltage node, a first conduction node coupled to the second conduction node of the third transistor and a second conduction node coupled to the output node.

* * * * *